US012683361B1

(12) United States Patent
Denbaars et al.

(10) Patent No.: US 12,683,361 B1
(45) Date of Patent: Jul. 14, 2026

(54) COMPACT ULTRA-VIOLET LASER DIODE CONFIGURED FOR LIDAR SYSTEM FOR AIR TURBULENCE DETECTION

(71) Applicant: Palomino Laboratories, Inc., Palo Alto, CA (US)

(72) Inventors: Steven P. Denbaars, Palo Alto, CA (US); Dalton Eng-Denbaars, Palo Alto, CA (US)

(73) Assignee: Palomino Laboratories, Inc., Palo Alto, CA (US)

( * ) Notice: Subject to any disclaimer, the term of this patent is extended or adjusted under 35 U.S.C. 154(b) by 650 days.

(21) Appl. No.: 18/300,332

(22) Filed: Apr. 13, 2023

(51) Int. Cl.
| | |
|---|---|
| *H01S 5/343* | (2006.01) |
| *G01S 17/933* | (2020.01) |
| *H01S 5/00* | (2006.01) |
| *H01S 5/125* | (2006.01) |
| *H10H 20/825* | (2025.01) |
| *G01S 17/894* | (2020.01) |

(52) U.S. Cl.
CPC ........ *H01S 5/34333* (2013.01); *G01S 17/933* (2013.01); *H01S 5/0064* (2013.01); *H01S 5/125* (2013.01); *H01S 5/34346* (2013.01); *H10H 20/825* (2025.01); *G01S 17/894* (2020.01)

(58) Field of Classification Search
CPC .................................................. H01S 5/34333
See application file for complete search history.

(56) References Cited

U.S. PATENT DOCUMENTS

| | | | |
|---|---|---|---|
| 8,072,584 | B2 | 12/2011 | Caldwell et al. |
| 9,800,016 | B1 * | 10/2017 | Raring .............. H01S 5/320275 |
| 2012/0179376 | A1 | 7/2012 | O'Brien et al. |
| 2015/0247953 | A1 * | 9/2015 | O'Brien .................. G01W 1/10 |
| | | | 416/41 |
| 2019/0302141 | A1 | 10/2019 | Caldwell et al. |
| 2020/0403375 | A1 * | 12/2020 | Wunderer ............. H01S 5/1234 |

FOREIGN PATENT DOCUMENTS

JP 2009117578 A * 5/2009 ............. H01S 5/187

OTHER PUBLICATIONS

English translation of Arimura (Year: 2009).*
Patrick Vrancken et al. "Airborne forward-pointing UV Rayleigh lidar for remote clear air turbulence detection: system design and performance", Applied Optics, Nov. 10, 2016,vol. 55, No. 32, http://dx.doi.org/10.1364/AO.55.009314.
(Continued)

*Primary Examiner* — Minsun O Harvey
*Assistant Examiner* — Stephen Sutton Kotter
(74) *Attorney, Agent, or Firm* — Richard T. Ogawa; Ogawa P.C.

(57) ABSTRACT

According to the present invention, techniques related generally to correction of atmospheric turbulence beam control (CAT) configured with a distributed feedback (DFB) laser diode device are provided. In particular, the present invention provides a method and system for using a DFB laser diode device for correcting atmospheric turbulence beam control. Merely by way of example, the invention can be applied to a variety of applications, including satellites, weather, airplanes, spaceships, naval vessels, or among other navigational tools.

26 Claims, 8 Drawing Sheets

(56) References Cited

OTHER PUBLICATIONS

Haojun Zhang et al. "Continuous-wave operation of a semipolar InGaN distributed-feedback blue laser diode with a first-order indium tin oxide surface grating", Optics Letters, Jun. 15, 2019, vol. 44, No. 12, https://doi.org/10.1364/OL.44.003106.
Qing Cai et al. "Progress on AlGaN-based solar-blind ultraviolet photodetectors and focal plane arrays", 2021, Light: Science & Applications, Official journal of the CIOMP 2047-7538.

* cited by examiner

Multiple Quantum Well Active Region of UV Laser Diode

| |
|---|
| AlGaN EBL |
| 3.5 nm AlGaN QW |
| 7 nm AlGaN Barrier |
| 3.5 nm AlGaN QW |
| 7 nm AlGaN Barrier |

FIGURE 2B

COMPACT ULTRA-VIOLET LASER DIODE CONFIGURED FOR LIDAR SYSTEM FOR AIR TURBULENCE DETECTION

CROSS REFERENCE TO RELATED APPLICATIONS

N/A

BACKGROUND OF INVENTION

The present invention relates generally to techniques related to correction of atmospheric turbulence beam control (CAT) configured with a distributed feedback (DFB) laser diode device. In particular, the present invention provides a method and system for using a DFB laser diode device for correcting atmospheric turbulence beam control for an aircraft configuration. Merely by way of example, the invention can be applied to a variety of applications, including satellites, weather, airplanes, spaceships, naval ships, submarines, drones, and automotive vehicles, among others.

In addition to being hazardous to flight crew, passengers, and the airplane itself, atmospheric turbulence can cause significant degradation of laser beams and other optical signals that are transmitted through the atmosphere. The degradation can be especially problematic for aircraft and other vehicles that rely on such signals for communication, navigation, and other critical functions. To mitigate the effects of atmospheric turbulence, several techniques have been developed for correction of the turbulence-induced distortions in the optical signals.

Various conventional techniques are described. Adaptive optics (AO) is a technique that involves the use of a deformable mirror (DM) that can be controlled by a wavefront sensor. The wavefront sensor measures the distortions in the incoming signal caused by the atmospheric turbulence and sends the information to the DM, which then corrects the distortions in real-time. The technique has been used in many applications, including laser communications, Light Detection and Ranging, i.e., LiDAR, and directed energy systems.

Alternative, phase conjugation is a technique that involves the use of a nonlinear optical medium to generate a replica of the distorted beam with the opposite phase. The two beams are then combined to cancel out the distortions. The technique has been used in laser communications and directed energy systems. Coherent beam combining is yet another technique that involves the combination of several laser beams to form a single high-power beam. The technique uses the interference of the individual beams to cancel out the distortions caused by the atmospheric turbulence. This technique has been used in directed energy systems and LIDAR. Furthermore, multi-aperture imaging (MAI) is a technique that involves the use of several small telescopes to form an image of the object being observed. The individual images are then combined to form a high-resolution image. The technique uses the fact that the atmospheric turbulence affects each telescope differently, and the combination of the individual images can cancel out the distortions caused by the turbulence. The technique has been used in astronomical observations and remote sensing applications.

Despite the advances from these techniques, several shortcomings exist. At high altitudes there exists a lack of moisture and aerosol particles, such that infrared laser system does not detect clear air turbulence. This greatly reduces the range, accuracy, and rapid response timing of the information based on quickly changing wind conditions.

Conventional shorter wavelength laser systems can use the enhanced Rayleigh scattering observed at shorter wavelengths to overcome these shortfalls. However, conventional short wavelength laser systems typically rely on gas laser, or bulky third harmonic generation from conventional solid-state lasers.

From the above, it is still desired to improve techniques for atmospheric wavefront corrections and related systems.

SUMMARY OF THE INVENTION

To overcome the limitations of the prior art described above, the present invention discloses a compact Rayleigh LiDAR system incorporating UV laser diodes grown using aluminum gallium nitride ("AlGaN") based compound semiconductors. This results in a compact LiDAR system, which detects and calculates the velocity, magnitude, and direction of atmospheric turbulence, even at high altitudes. The Rayleigh LiDAR detection technique relies on air density fluctuation measurement and is thus independent of backscatter from hydrometeors and aerosol particles such as rain, fog, or other particulates.

In an example, the present techniques can rapidly and accurately alert the pilot to possible vertical or horizontal wind shear, also known as clear air turbulence, as it is invisible to the naked eye and other detection instruments. With our LiDAR techniques however, the pilot is able to readjust course to either prepare or avoid the atmospheric turbulence, which can lead to danger for the pilot.

In an example, the present invention provides a light detection and ranging system, i.e., LiDAR. In an example, a LiDAR (e.g., Light Detection and Ranging) system that uses a UV (ultraviolet to blue) or other laser is a remote sensing technology that uses light in the UV spectrum to measure distances and create a representation of entities, objects, and surfaces, as well as scattered light off entities such as air turbulence.

In an example, the system has an aluminum, gallium, and nitride containing laser diode device configured to emit electromagnetic radiation having a wavelength ranging from 280 nm to 470 nm, e.g., ultraviolet to blue. In alternative examples, the laser diode device can emit longer wavelengths in the visible range as well. Further details of the present laser diode can be found throughout the present specification and more particularly below.

In an example, the system has other elements. The system has a sensing device operably coupled to the AlGaN containing laser diode device and configured to receive a signal scattered from an interaction of an air turbulence and an emission of the electromagnetic radiation. The sensor is able to detect the air turbulence from the scattered signal.

In an example, the system has a controller operably coupled to the sensing device and the AlGaN containing laser diode device. The controller is adapted to process a signal generated from the sensing device.

In an example, the present invention is related to a fabrication method of an ultraviolet laser diode (LD) with an emission wavelength between 280 nm to 400 nm and incorporating it in a compact LiDAR system.

Of course, one of ordinary skill in the art would recognize other variations, modifications, and alternatives.

Depending upon the example, the present invention can achieve one or more of these benefits and/or advantages. In an example, the present invention provides a correction technique using a distributed feedback (DFB) laser device. In an example, the present invention offers advantage of size weight and cost reduction for lasers. With multiple smaller lasers able to be externally mounted, and other benefits. That is, the laser is solid state, compact, and capable of being mounted and/or used in spatially smaller areas without sacrificing power in some examples. These and other benefits and/or advantages are achievable with the present device and related methods. Further details of these benefits and/or advantages can be found throughout the present specification and more particularly below.

A further understanding of the nature and advantages of the invention may be realized by reference to the latter portions of the specification and attached drawings.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which:

FIG. 2B is a simplified cross-sectional view of a quantum well region for the AlGaN laser diode and associated layers according to an example of the present invention.

DETAILED DESCRIPTION OF THE EXAMPLES

Figure 1:
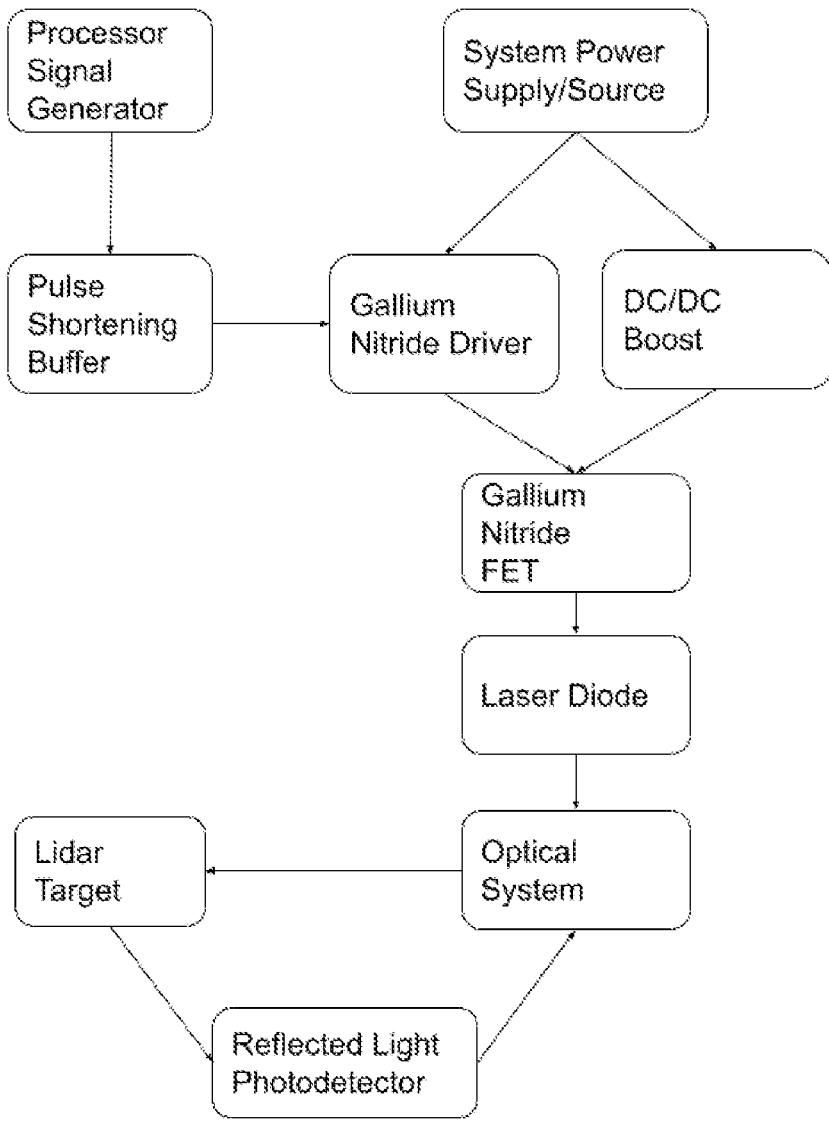
FIG. 1 is a simplified diagram illustrating an overall LiDAR system, laser diode device, and other integrated devices according to an example of the present invention.

In the following description of the preferred embodiment, reference is made to the accompanying drawings which form a part hereof, and in which is shown by way of illustration a specific embodiment in which the invention may be practiced. It is to be understood that other embodiments may be utilized, and structural changes may be made without departing from the scope of the present invention.

In an example, detection of clear air turbulence using a laser light source and photodetector is a technique known as laser-based remote sensing. This technique works by detecting the small changes in refractive index that occur in the air due to turbulence. When an ultra-violet laser beam is sent through the air, it interacts with the tiny dust and aerosol particles that are naturally present in the atmosphere. As these particles move due to turbulence, they cause slight changes in the refractive index of the air, which affects the path of the laser beam.

In an example, a photodetector is used to detect the laser light after it has traveled through the turbulent air. By analyzing the changes in the laser's path and intensity, the turbulence can be measured and quantified. This information can then be used to correct for the turbulence and improve the performance of aircraft or other airborne systems.

One of the advantages of this technique is that it allows for non-intrusive measurements of the turbulence, without requiring physical sensors to be placed in the air. It also provides high spatial resolution and can detect turbulence at ranges of up to several kilometers. The technique is also compact, remote, and can be configured on aircraft and other vehicles.

As an example, Rayleigh backscattering is a phenomenon that occurs when a laser beam is directed through a medium such as air. The beam interacts with the particles present in the air, causing the light to scatter in all directions. The scattered light is then detected by a receiver and can be analyzed to extract information about the properties of the medium.

To detect air turbulence using scattered light from a laser light source, a technique known as laser Doppler anemometry (LDA) can be used. This technique involves directing a laser beam into the air and measuring the frequency shift of the scattered light that is returned to a receiver. The frequency shift is caused by the movement of the air particles due to turbulence and can be used to calculate the velocity and direction of the air flow.

One way to implement LDA is to use a dual-beam laser system, where two beams of light are directed into the air at different angles. The scattered light from each beam is detected by a receiver, and the frequency shift is measured for each beam. By analyzing the difference in frequency shift between the two beams, the velocity and direction of the air flow can be determined.

Another technique that can be used to detect air turbulence using scattered light is known as laser speckle velocimetry (LSV). This technique involves illuminating a small area of the air with a laser beam and analyzing the pattern of scattered light that is produced. The pattern of scattered light, known as speckle, is affected by the movement of air particles due to turbulence. By analyzing changes in the speckle pattern over time, the velocity and direction of the air flow can be calculated.

Both LDA and LSV are non-intrusive techniques that can provide high spatial resolution measurements of air turbulence. However, they require careful calibration and are affected by factors such as atmospheric absorption and scattering of the laser beam.

According to the present invention, techniques related generally to correction of atmospheric turbulence beam control (CAT) configured with a distributed feedback (DFB) laser diode device are provided. In particular, the present invention provides a method and system for using a DFB laser diode device for correcting atmospheric turbulence beam control. Merely by way of example, the invention can be applied to a variety of applications, including satellites, weather, airplanes, spaceships, naval vessels, or among other navigational tools.

This principle of Rayleigh LiDAR turbulence detection by air density fluctuation has already been tested with bulky frequency tripled Nd:YAG laser systems with some success. [1] Flight test measurements demonstrated clear air turbulence (CAT) detection out to 10 km, with potential out to 25 km. However, the machinery used in these previous studies have a severe drawback in excessive weight. The devices were large and heavy, in the several hundreds of pounds (e.g., 100 lbs), and were impractical for use in avionics for clear air turbulence detection.

Technological improvements have allowed for the development of certain compact (<0.1 cc) and light (e.g., up to 5 μm, 10 gm, 20 gm) UV laser diodes based on the AlGaN material system. [2] Reducing not only the empty mass and excess weight of possible aeronautical subsystems, but also lowering power draw and allowing longer device lifetime and greater reliability.

In an example, the AlGaN-based laser diodes include emission wavelengths between 280 nm and 400 nm and have numerous applications in the fields of lithography, material processing, chemical or material sensing, data storage, medical treatment, cytometry, communications, and others. This wavelength range is usually referred to as ultraviolet A (UVA) encompassing a wavelength range of 315-400 nm, and ultraviolet B (UVB), encompassing a wavelength range of 280-315 nm. The active region in the device where the light is generated for this wavelength range is usually composed of $Al_xGa_{1-x}N$ with an Al composition (X) ranging from 0 to 0.5. In AlGaN UV LDs with shorter wavelength than 280 nm, commonly referred as ultraviolet C (UVC) encompassing a wavelength range of 100-280 nm, there have been multiple demonstrations of external quantum efficiency (EQE) above 10% when using aluminum nitride (AlN) on sapphire or bulk AlN substrates. In an example, developments in high temperature annealing, AlN templates with a threading dislocation density (TDD)<5× $10^8$ $cm^{-2}$ are included.

Due to the low TDD in the substrate and the small lattice mismatch between the substrate and the active region, the density of non-radiative defects, such as threading dislocations (TDs), can be minimized in the active region because of the relatively small amount of strain in the quantum wells (QWs) and barriers (QBs) required for <=280 nm emission. However, adapting the UVC device structure to devices with longer emission wavelengths, by adjusting the Al composition in the active region, poses several challenges, which are overcome by techniques described in the specification.

In an example, the present invention provides a light detection and ranging system, i.e., LiDAR. In an example, a LiDAR (Light Detection and Ranging) system that uses a UV (ultraviolet) or other laser is a remote sensing technology that uses light in the UV spectrum to measure distances and create 3D representations of objects and surfaces, as well as scattered light off air turbulence. In an example, the system works by emitting short pulses of UV laser light, which bounce off objects and return to the LiDAR receiver. By measuring a time it takes for the laser light to travel to the object and back, the LiDAR system can determine the distance to the object. This process is called "time-of-flight" measurement.

In addition to distance measurement, the UV LiDAR system can also collect information about the reflectivity of the object, which can be used to create a detailed 3D map of the object or environment. This is done by measuring the intensity of the reflected UV light. UV LiDAR systems are often used in applications where high-precision distance measurements and 3D mapping are required, such as in detecting air turbulence, autonomous vehicles, aerospace, and environmental monitoring.

In an example, the system has an aluminum, gallium, and nitrogen (e.g., AlGaN) containing laser diode device configured to emit electromagnetic radiation having a wavelength ranging from 280 nm to 470 nm. In alternative examples, the laser diode device can emit longer wavelengths in the visible range as well. Further details of the present laser diode can be found throughout the present specification and more particularly below.

In an example, the system has other elements. The system has a sensing device operably coupled to the AlGaN containing laser diode device and configured to receive a signal scattered from an interaction of an air turbulence and an emission of the electromagnetic radiation. The sensor is able to detect the air turbulence from the scattered signal.

In an example, the system has a controller operably coupled to the sensing device and the AlGaN containing laser diode device. The controller is adapted to process a signal generated from the sensing device. In an example, the LiDAR system can be used to detect clear air turbulence by transmitting laser pulses into the atmosphere and measuring the backscattered light. A time delay between the transmitted and received signals can be used to determine the distance to the scattering point, which can then be used to identify turbulent regions in the atmosphere. To generate the signal for use in the LiDAR system, a controller is required to control the laser source. The controller typically consists of a microcontroller or digital signal processor (DSP) that is responsible for generating the laser pulse, controlling the laser power and repetition rate, and triggering the receiver circuitry.

In an example, the controller may also incorporate signal processing algorithms to improve the accuracy of the LiDAR measurements, such as filtering out noise and unwanted signals. These algorithms may be implemented in hardware or software and may include techniques such as averaging and Fourier transform analysis. To detect the signal from scattered light, the LiDAR system typically incorporates a photodetector, such as a photomultiplier tube (PMT) or avalanche photodiode (APD), to convert the incoming light into an electrical signal. The detector is typically placed behind a lens or other focusing element to maximize the amount of scattered light that is collected.

In an example, the controller is responsible for amplifying and processing the detector signal, typically using a preamplifier and signal conditioning circuitry. The signal may then be digitized and further processed using signal processing algorithms to extract the relevant information about the turbulence. Further details of the system can be found throughout the present specification and more particularly below.

FIG. 1 is a simplified diagram illustrating an overall LiDAR system, laser diode device, and other integrated devices according to an example of the present invention. As shown, the system has a power supply configured to provide power (e.g., direct current (DC)) to a gallium nitride driver and boost module, each of which is coupled to a gallium nitride field effect transistor. As shown, a processor signal generator generates a signal to a pulse shortening buffer, which provides a frequency modulation signal to the gallium nitride driver and field effect transistor (FET). The modulated signal (e.g., current) from the FET is boosted by the DC/DC boost module including circuit to supply power a AlGaN based UV laser diode device.

As shown, the AlGaN laser device emits an electromagnetic laser beam through an optical system to output the laser beam to a target, which reflects back a scattered light that is detected using a detector (e.g., photodiode, a silicon based photodetector).

In an example, the system has an input handler configured to the sensing device. The input handler is coupled to process the signal in an inference engine comprising a plurality of nodes. In an example, the number of nodes ranges from 10,000 to over 1 million to output a signal detecting clear air turbulence or another anomaly. The output is coupled to an output handler, which is configured to allow a pilot of an aircraft or other vehicle to steer away from air turbulence or another anomaly. In an alternative example, a wavefront from the turbulence can be corrected dependent upon the application.

Further details of the laser device can be found throughout the present specification and more particularly below.

Figure 2:
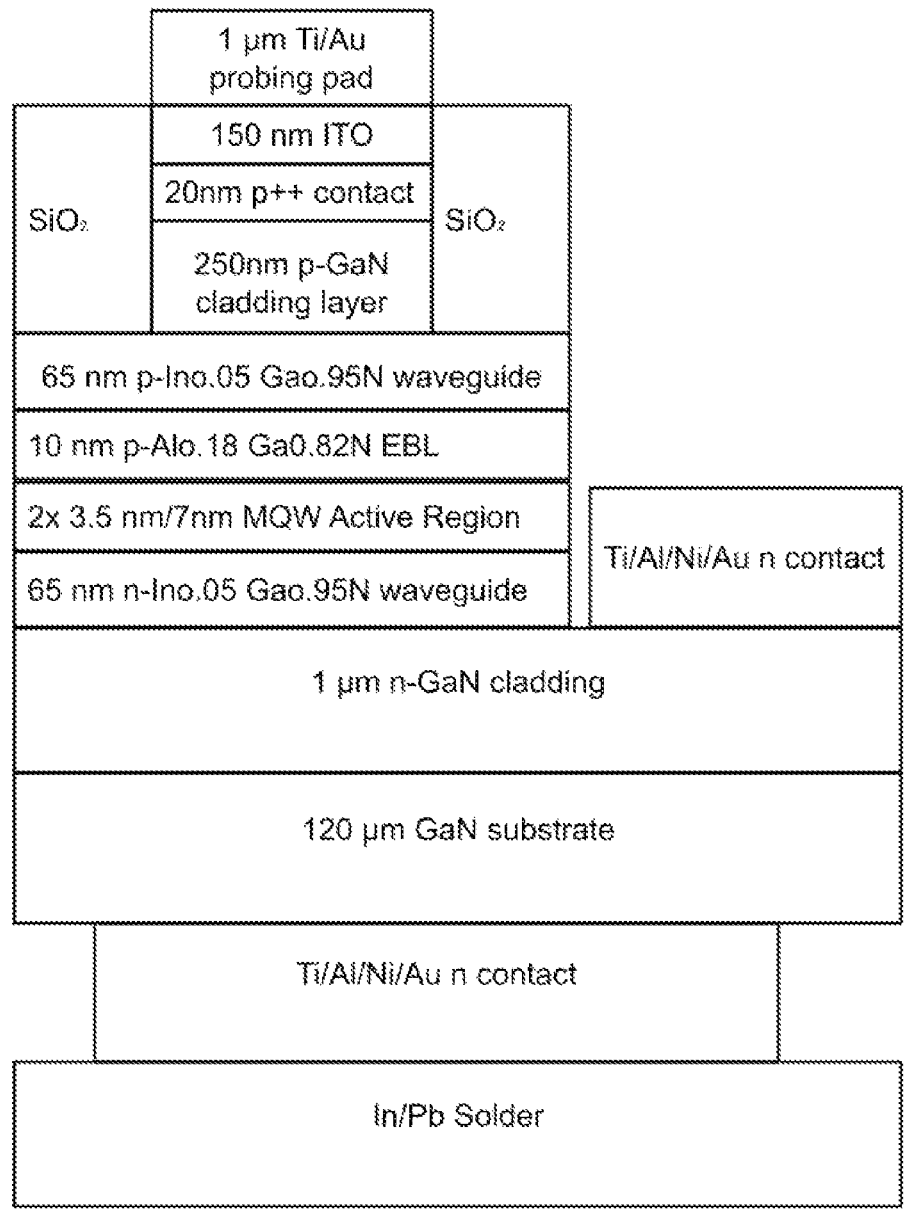
FIG. 2 is a simplified cross-sectional view of the AlGaN laser diode and associated layers according to an example of the present invention.

FIG. 2 is a simplified cross-sectional view of an AlGaN laser diode and associated layers according to an example of the present invention. As shown the cross-sectional view includes a solder material, which is bonded to a substrate member (not show). The solder material has an overlying n-type contact region, e.g., titanium, aluminum, nickel, and gold. As shown, the device has a gallium nitride (GaN) substate member and an overlying n-type GaN cladding material. A pair of waveguide regions are configured to enclose a multi-quantum well region configured with an electron blocking material, e.g., layer or layers. The waveguide regions comprise aluminum, gallium, and nitride containing materials, and include an n-type waveguide and a p-type waveguide. An n-type contact is overlying an exposed portion of the n-type cladding material. The device also has stack including a p-type GaN cladding material, p++ type contact, and overlying indium tin oxide material, which are between a pair of insulating regions, e.g., silicon dioxide. The stack has an overlying titanium gold pad region, as shown.

Figure 2A:
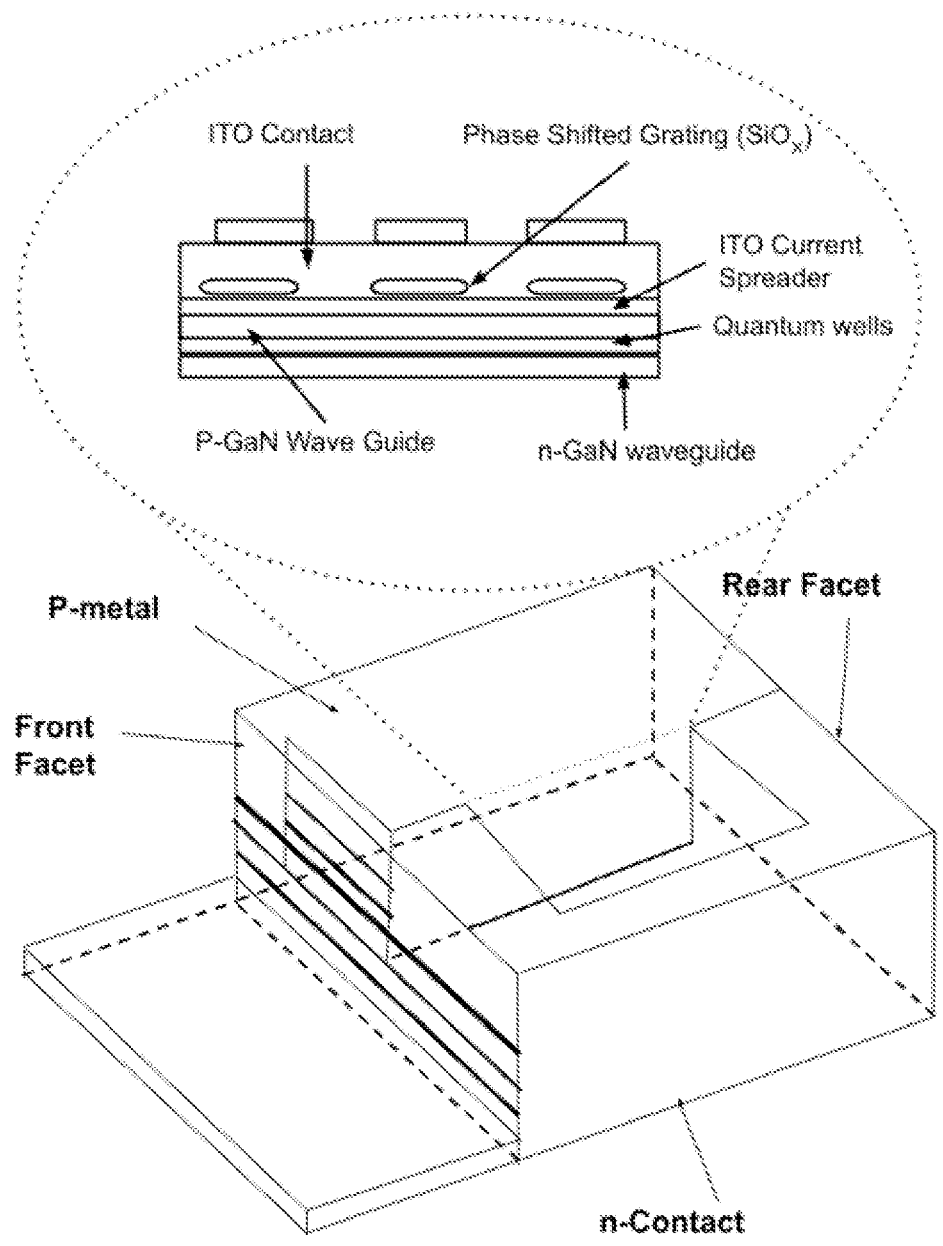
FIG. 2A is a simplified alternative cross-sectional view and perspective view of the AlGaN laser diode and associated layers according to an example of the present invention.

In an example, the device also has a pair of facets, including a front facet and a back facet, as shown in FIG. 2A. The device has a grating region, which can include a single grating structure or multiple grating structures. The device also has an optical cavity configured between the pair of waveguides and between the pair of facets, each of which can be cleaved or preferably etched for formation. In an example, the device includes a front facet and a back facet, metallization, a quantum well region, grating region, an n-type waveguide, a p-type waveguide, among other elements. The grating region can be made using an indium tin oxide or alternative a silicon dioxide material.

In an example, at least a dry etching process forms a front facet coupled to a front side of the n-type gallium nitride containing waveguide material and a front side of the p-type gallium nitride containing waveguide material. In an example, the front facet comprises an antireflective coating. At least the dry etching process forms a back facet coupled to a back side of the n-type gallium nitride containing waveguide and a back side the p-type gallium nitride containing waveguide. The back facet comprises an optical coating such that an optical cavity is configured between the front facet and the back facet including the plurality of quantum well regions defined between the front facet and the back facet.

At least a patterning process forms a monolithically integrated diffraction grating configured within or overlying the contact region and configured to reflect electromatic radiation emitted from one or more of the plurality of quantum well regions and cause the electromagnetic radiation to amplify the electromagnetic radiation using stimulated emission in the optical cavity. The laser outputs a laser light beam from the front facet such that a characteristic dimension of $m(\lambda/2n)$ characterizing a pitch of two or more lines configured in the monolithically integrated diffraction grating, where m is an order of a grating and n is a refractive index of a semiconductor material for the optical cavity.

In an example, the dry etching process comprises a chemically assisted ion beam etching (CAIBE) or other dry etching technique. In an example, the dry etching process uses a chlorine and argon containing plasma or other suitable chemistry. In an example, the patterning process comprises a Reactive Ion Etching (RIE), dry etching, or wet chemical etching, or any combinations thereof. The reactive ion etch and dry etching can use a chlorine based or fluorine based chemistry along with argon material in an example. Wet etching can occur using fluorine or chlorine based acids and other suitable chemistry.

In an example, details of the quantum well regions are illustrated by FIG. 2B. In an example, the device has a first barrier material, a first quantum well region overlying the first barrier material, a second barrier material overlying the first quantum well region, a second quantum well region overlying the second barrier material, and the overlying AlGaN containing electron blocking region, e.g., layer. Further details of the present device can be found throughout the present specification and more particularly below.

In an example, the laser diode comprises a gallium and nitride containing substate member, e.g., GaN. The device has an n-type gallium nitride containing cladding material overlying the substrate member. In an example, the device has an n-type waveguide material overlying the cladding material. In an example, the device has a first barrier material overlying the n-type gallium nitride material. In an example, the first barrier material comprises an aluminum, gallium, and nitrogen containing material.

In an example, the device has a plurality of quantum well regions overlying the first barrier material. Preferably, the plurality of quantum well regions comprise at least a first quantum well region and a second quantum well region. In an example, each of the quantum well regions range in thickness from 2 nanometers to 5 nanometers, although there can be variations. Each quantum well region comprises an aluminum, gallium, and nitrogen containing material. In an example, the device has a second barrier material comprising aluminum, gallium, and nitrogen (or alternatively aluminum, gallium, scandium, and nitrogen) containing material configured between the first quantum well region and the second quantum well region.

In an example, the device has a confinement factor characterizing each of the quantum well regions is greater than one percent per quantum well region. In a laser, a confinement factor is a measure of the degree to which electrons are confined within a quantum well region. The quantum well is a region of the laser where electrons are confined in the plane perpendicular to the direction of propagation of light. The confinement factor is a measure of the degree to which electrons are confined within this quantum well region. The confinement factor is calculated by comparing the energy of the electron in the quantum well to the energy of the electron in the surrounding materials. The higher the confinement factor, the more tightly the electrons are confined within the quantum well, leading to a higher probability of the electrons emitting light when stimulated.

In an example, the device has an electron blocking material overlying the quantum well regions. The device has an n-type waveguide material, and an overlying p-type gallium and nitride containing cladding material overlying the waveguide material overlying the quantum well regions. The device has a contact region comprising an indium tin oxide material overlying the p-type gallium and nitrogen cladding material. Other types of transparent conductor materials can also be included in other examples.

In an example, the device has a front facet coupled to a front side the n-type aluminum gallium nitride containing waveguide and a front side of the p-type aluminum gallium nitride containing waveguide. In an example, the front facet comprises an optical coating, e.g., antireflective coating. In an example, the device has a back facet coupled to a back side of the n-type aluminum gallium nitride containing waveguide and a back side of the p-type aluminum gallium nitride containing waveguide. In an example, the back facet comprises an optical coating, e.g., antireflective coating, reflective coating.

In an example, the device has an optical cavity configured between the front facet and the back facet and includes the plurality of quantum well regions defined between the front face and the back facet.

In an example the device has a monolithically integrated diffraction grating configured within or overlying the contact region and configured to reflect electromatic radiation emitted from one or more of the plurality of quantum well regions and cause the electromagnetic radiation to amplify the electromagnetic radiation using stimulated emission in the optical cavity thereby outputting a laser light beam from the front facet.

In an example the device has a characteristic dimension of m($\lambda$/2n) characterizing at least distance between a pair of lines or a plurality of lines with a pitch of the monolithically integrated diffraction grating, where m is the order of a grating and n is a refractive index of a semiconductor material for the optical cavity.

In an example, the monolithically integrated diffraction grating comprises a single grating region or a plurality of grating regions. The p-type gallium nitride containing waveguide material comprises aluminum and the n type gallium nitride containing waveguide material comprises aluminum.

In an example, the pair of facets are coated with an optical coating. In an example the front facet comprises an antireflective coating or a reflective coating for the optical coating. In an example, the antireflective coating on the front facet and the back facet characterizes a phase shifted distributed feedback laser device. In an example, the antireflective coating on the back facet and the reflective coating on the front facet characterize a non-phase shifted distributed feedback laser device.

In an example, the AlGaN containing laser device is monolithically integrated to form a compact structure. In an example, the AlGaN containing laser device is a distributed feedback laser device or a tunable laser diode device configured for emitting a blue color light.

In an example the AlGaN laser emits electromagnetic radiation having a wavelength range selected from 450-470 nm, 400-460 nm, 320-400 nm, or 250-320 nm, but can be others.

In an example, the AlGaN containing laser diode device is pulsed by direct current configured to a modulation.

In an example, the AlGaN containing laser diode device is modulated by an integrated modulator. In an example, the AlGaN containing laser diode device is steered and reflected into the sensor device using a free space optical system, shaped lens, a MEMS system, or steerable mirror. In an example, the system has a driver device coupled to the AlGaN containing laser diode device.

In an example, the AlGaN containing laser diode device further comprises a power of one milliwatt and greater characterizing the AlGaN containing laser diode device. Other power ratings that are higher can be used such as up to 100 milliwatt, 1 watt, 10 watts, and others.

In an example, the present invention provides a method for fabricating an aluminum gallium nitride containing laser device configured to emit a laser beam having a wavelength ranging from 280 to 470 nanometers, among other wavelengths. The method includes providing a gallium and nitride containing substate member having a front side surface and a back side surface. In an example, the substrate can be a bulk substrate or a composite layered substrate material, e.g., gallium nitride on silicon, silicon carbide, or sapphire.

In an example, the method includes a cleaning step. The method includes treating the front side surface to an organic solvent clean comprising an acetone dip. The acetone dip can be followed by an isopropanol dip. In an example, a deionized water rinse is then used to remove any organic contaminants from at least the frontside surface. Of course, there can be alternatives, variations, and modifications.

In an example, the method includes forming an n-type gallium nitride containing cladding material overlying the substrate member having a thickness of 10 nm to 4 microns, among others. The cladding material is configured with dopant of silicon atoms having a concentration ranging from 1E+16 cm−3 to 1E+20 cm−3, among others. The method includes forming a first n-type aluminum gallium nitride containing waveguide material overlying the n-type gallium nitride containing cladding material. In an example, the first n-type gallium nitride material has a thickness ranging from 10 nm to 150 nm and a dopant of silicon atoms having a concentration ranging from 1E+16 cm−3 to 1E+20 cm−3, among others.

In an example, the method includes forming a first barrier material overlying the first n-type gallium nitride material. The first barrier material comprises an aluminum, gallium, and nitrogen containing material and having a thickness ranging from 1 nm to 20 nm, among others.

In a preferred example, the method includes forming a plurality of quantum well regions such that a confinement factor characterizing each of the quantum well regions is greater than one percent per quantum well. The method forming the quantum well regions overlying the first barrier material. The plurality of quantum well regions comprises at least a first quantum well region and a second quantum well region, among others, third, fourth, fifth, sixth, seventh . . . tenth, where the number is greater than two but can be one. In an example, each of the quantum well regions ranging in thickness from 2 nanometers to 8 nanometers in an example. Each quantum well region comprises an aluminum, gallium, indium and nitrogen containing material, among others.

In an example, the method includes forming a second barrier material comprising aluminum, gallium, and nitrogen containing material configured between the first quantum well region and the second quantum well region and overlying the first quantum well region before forming the second quantum well region, the second barrier region having a thickness, e.g., ranging from 2 nm to 8 nm. The method includes forming an electron blocking material overlying the quantum well regions. The electron blocking material comprises aluminum, gallium, indium and nitrogen and having a thickness, e.g., ranging from 1 nm to 20 nm.

In an example, the method includes forming a p-type gallium nitride containing waveguide material overlying the electron blocking material. The p-type gallium nitride containing waveguide material has a thickness, e.g., ranging from 10 nm to 150 nm, and a dopant of magnesium atoms having a concentration, e.g., ranging from 1E+16 cm−6 to 1E+20 cm−3. In an example, the method includes forming a p-type gallium and nitride containing cladding material overlying the p-type gallium nitride containing waveguide material. In an example, the p-type gallium and nitride containing material has a thickness, e.g., ranging from 1 nm to 50 nm, and a dopant of magnesium atoms having a concentration, e.g., ranging from 1E+16 cm−6 to 1E+20 cm−3.

To complete the device, the method includes forming a contact region comprising an indium tin oxide material overlying the p-type gallium and nitrogen cladding material. In an example, the contact region has a thickness, e.g., ranging from 1 nm to 200 nm. In an example, etching or cleaving forms facets, each of which has an optical coating. In an example, the coating can be both antireflective, reflective, or a combination.

In an example, the method includes at least a patterning process, e.g., reactive ion etching, dry etching, wet etching, or a combination, to form a monolithically integrated diffraction grating configured within or overlying the contact region and configured to reflect electromatic radiation emitted from one or more of the plurality of quantum well regions. The diffraction grating causes the electromagnetic radiation to amplify the electromagnetic radiation using stimulated emission in the optical cavity thereby outputting a laser light beam from the front facet such that a characteristic dimension of $m(\lambda/2n)$ characterizing a pitch of two or more lines configured in the monolithically integrated diffraction grating, where m is an order of a grating and n is a refractive index of a semiconductor material for the optical cavity.

In an example, the present technique uses various compounds of gallium nitride. In an example, gallium nitride (GaN), aluminum gallium nitride (AlGaN), indium gallium nitride (InGaN), and aluminum indium gallium nitride (AlInGaN) are included. In an example, such gallium nitride compound semiconductors can be formed in an undoped, p-type, and n-type doped states.

In an example, undoped GaN, AlGaN, InGaN, and AlInGaN can be formed using various methods such as molecular beam epitaxy (MBE), metal-organic chemical vapor deposition (MOCVD), or hydride vapor phase epitaxy (HVPE). In MBE, the material is grown by depositing individual atoms or molecules on a substrate in a high vacuum environment. In MOCVD, a mixture of metalorganic precursors and nitrogen gas is used to deposit the material on a substrate. In HVPE, a mixture of halide gases and ammonia gas is used to deposit the material on a substrate. The undoped material has a high electron mobility and can be used for high-power and high-frequency devices.

In an example, to make p-type GaN, AlGaN, InGaN, and AlInGaN, impurities such as magnesium (Mg) or zinc (Zn) are introduced during the growth process. These impurities act as acceptors and create holes in the valence band, which results in a material with a positive charge carrier concentration. To make n-type GaN, AlGaN, InGaN, and AlInGaN, impurities such as silicon (Si) or oxygen (O) are introduced during the growth process. These impurities act as donors and create extra electrons in the conduction band, which results in a material with a negative charge carrier concentration.

In an example, techniques for forming various gallium nitride materials use commonly used precursor gases for depositing these materials. For MOCVD, commonly used precursors for gallium include trimethylgallium (TMGa) and triethylgallium (TEGa), while ammonia (NH3) is typically used as the nitrogen source. For MBE, elemental gallium and nitrogen are typically used as the source materials. To deposit AlGaN, TMGa or TEGa can be used as the source of gallium, while trimethylaluminum (TMA) or triethylaluminum (TEA) can be used as the source of aluminum. The aluminum and gallium precursors are typically mixed in a specific ratio to achieve the desired aluminum composition in the material. For InGaN, TMGa, TEGa, and trimethylindium (TMIn) can be used as the source of gallium and indium, while NH3 is used as the nitrogen source. The composition of InGaN can be varied by adjusting the ratio of TMGa, TEGa, and TMIn. To deposit AlInGaN, TMGa, TEGa, TMA, and TEA can be used as the sources of gallium and aluminum, while TMIn can be used as the source of indium. The composition of AlInGaN can be varied by adjusting the ratio of the precursors. In addition to these precursors, other gases such as hydrogen (H2) or nitrogen (N2) can be used as carrier gases or to modify the growth conditions. Of course, one of ordinary skill in the art would recognize other variations, modifications, and alternatives.

Figure 3:
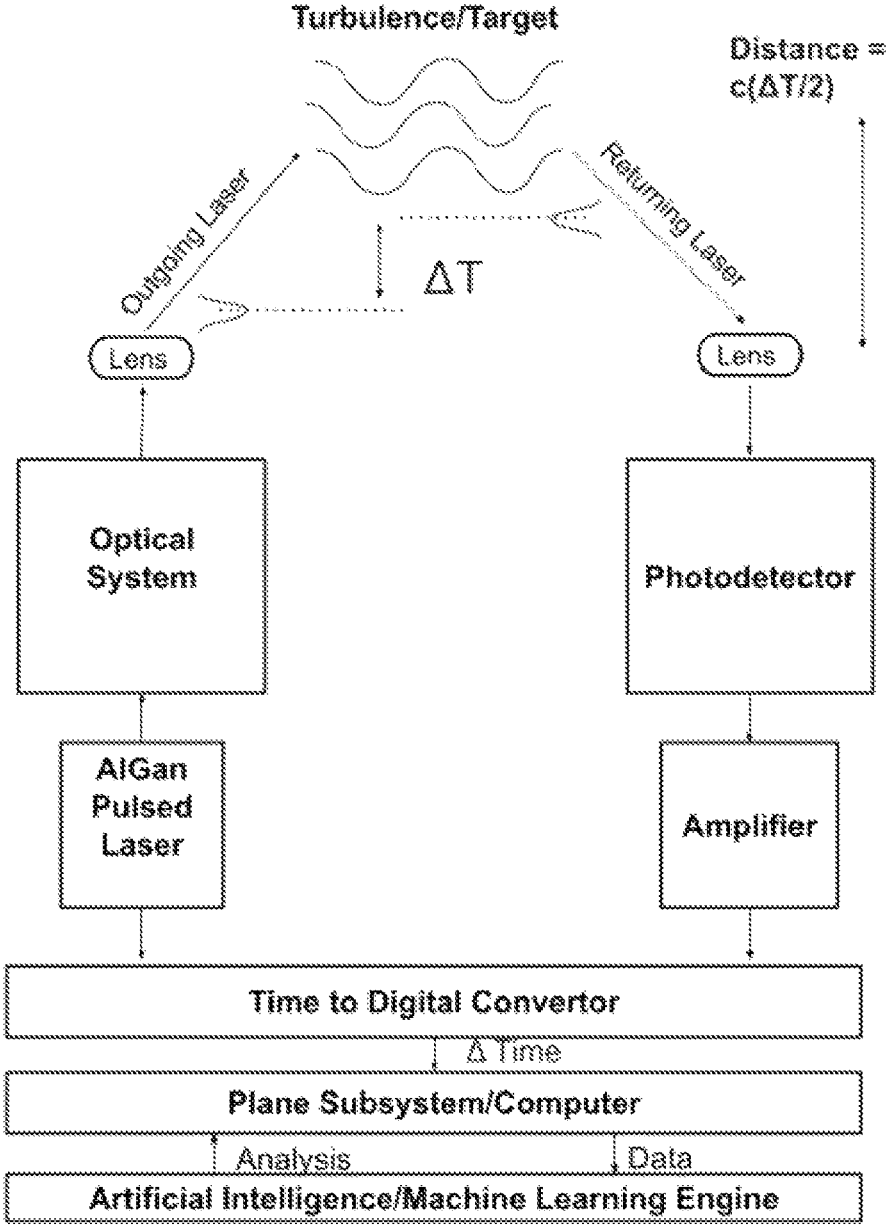
FIG. 3 is a simplified diagram of a laser diode and LiDAR system showing how data from clear air turbulence is transmitted according to an example of the present invention.

FIG. 3 is a simplified diagram of a laser diode and LiDAR system showing how data from clear air turbulence is transmitted according to an example of the present invention. As shown, system has a plane or vehicle computing subsystem. The subsystem is coupled to a converter device, as shown. In an example, the system has a light source for a transmit side including a driver, a pulsed AlGaN laser device, an optical system, and lens to output a laser beam of electromagnetic radiation toward an airspace.

In an example, the system has a receive side including a lens, photodetector device, an amplifier, each of which is coupled to a converter device, as shown. As shown, the laser beam traverses from the source through an optical system and lens to an airspace until the beam is reflecting off of a targeted turbulence. The reflected beam is received through a lens and into the photodetector and converted from an analog signal into a digital. Measuring the travel time from sending out the laser to receive and transmit data to a computer system to detect air turbulence. An artificial intelligence module is coupled to the computer system, as shown.

In an example, a technique using scattered light information off air turbulence from the present laser for an aircraft to correct its flight path using an artificial intelligence (AI) process involves various steps. In an example, the technique includes data collection and training. In an example, a laser can be mounted on the aircraft to emit a beam of light towards the atmosphere. As the beam travels through the atmosphere, it interacts with air molecules and generates scattered light. The scattered light contains information about the air turbulence in the atmosphere. This scattered light information can be collected using a high-resolution camera or detector mounted on the aircraft. The images captured by the camera can then be used to train an AI model to recognize patterns in the scattered light information that correspond to different levels of air turbulence.

In an example, the technique uses an inference engine: Once the AI model has been trained, it can be used as an inference engine to process real-time scattered light information received by the camera. The AI model can quickly analyze the scattered light data and identify the level of air turbulence in the aircraft's flight path. In an example, the technique uses flight path correction. The AI model can then send signals to the aircraft's autopilot system to make minor adjustments to the flight path to compensate for the air turbulence. The autopilot system can use this information to adjust the aircraft's altitude, heading, or speed to minimize the effects of air turbulence and provide a smoother ride for passengers.

For improvement, the technique includes feedback and refinement. As the AI model continues to process scattered light information, it can gather data on how well its corrections are working. This feedback can be used to refine the AI model, improving its accuracy over time. The AI model can also learn from the pilot's inputs and preferences, making adjustments to its algorithms based on the pilot's feedback. In an example, using scattered light information off air turbulence from a UV laser in conjunction with AI technology can improve the accuracy and efficiency of an aircraft's autopilot system, providing a smoother and safer flight experience for passengers. In an example, the LiDAR can be configured as a Rayleigh LiDAR technique, including system and method.

Figure 4:
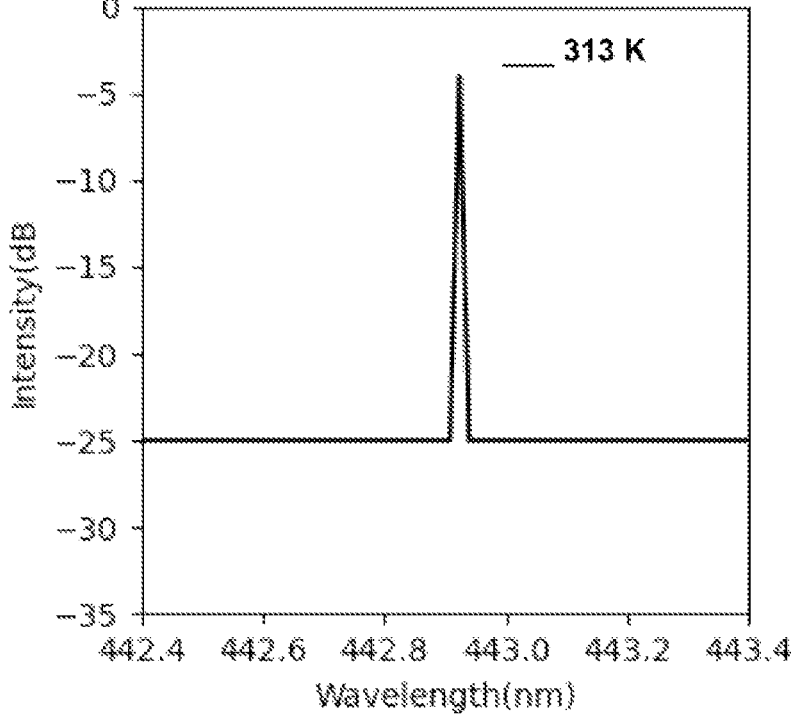
FIG. 4 is a simplified plot of a peak wavelength of a laser diode device configured in a LiDAR system according to an example of the present invention.

FIG. 4 is a simplified plot of a peak wavelength of a laser diode device configured in a LiDAR system according to an example of the present invention. As shown, intensity is plotted against wavelength. The laser diode device has a peak at about 442.9 nanometers, as shown.

Figure 5:
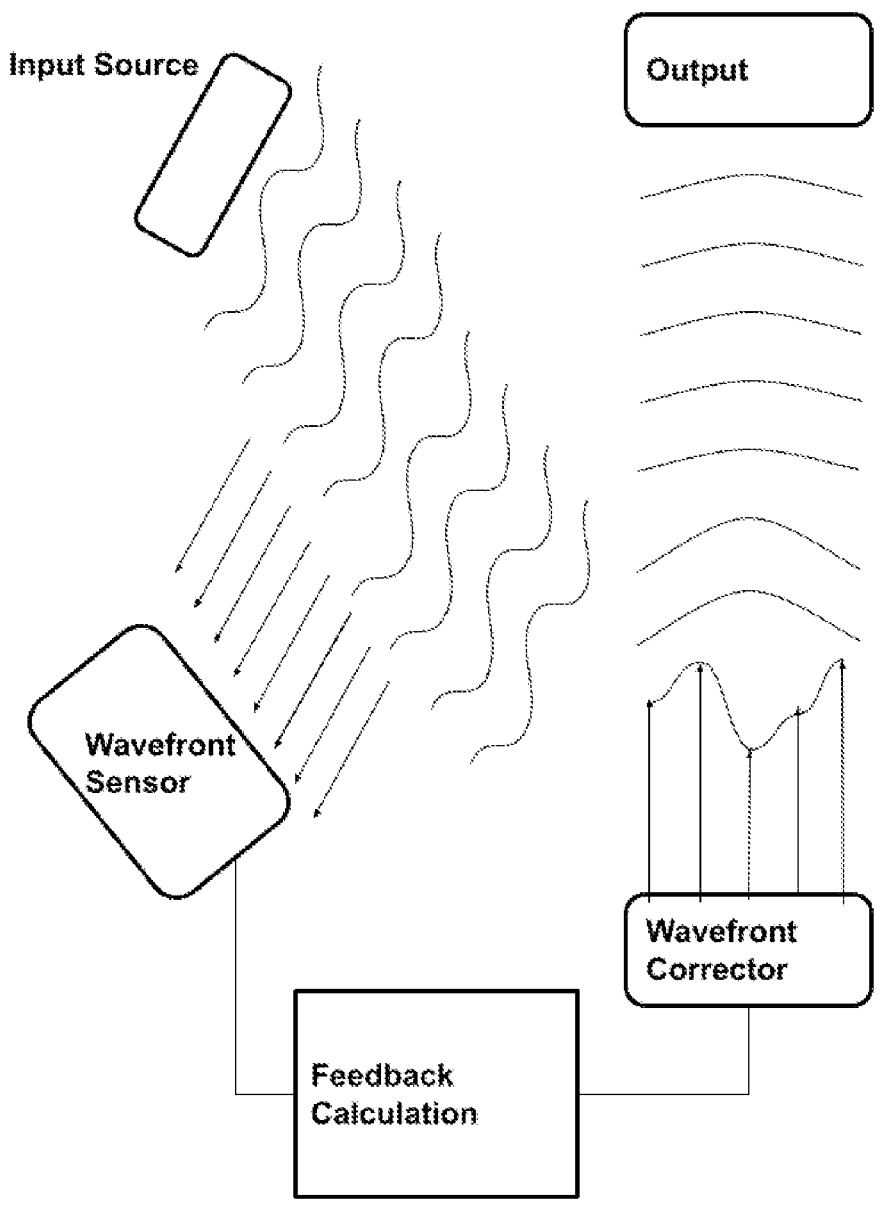
FIG. 5 is a simplified diagram of a wavefront correction and sensing device according to an example of the present system.

FIG. 5 is a simplified diagram of a wavefront correction and sensing device in a system according to an example of the present system. As shown, the system includes a laser source emitting electromagnetic radiation as a laser beam. In an example, the system has a sensor device configured to receive feedback from reflected and/or scattered light from air turbulence. The system has an output, wavefront corrector, and module for feedback, as shown.

In an example, wavefront correction using feedback from scattered light from a laser can be used to mitigate the effects of clear air turbulence. In an example, the process uses a laser to illuminate a small patch of air, and then uses the scattered light from this patch to measure the turbulence-induced wavefront distortion. The wavefront distortion can then be corrected using a deformable mirror, which can be adjusted to compensate for the distortion in real-time. The following is a general outline of the process:

The laser is pointed at a small patch of air, typically a few centimeters in size, and the scattered light is collected by a detector.

The detector measures the phase and amplitude of the scattered light, which contains information about the wavefront distortion caused by the turbulence.

The wavefront distortion is analyzed using a computer algorithm, which calculates the shape of the deformable mirror required to correct the distortion.

The deformable mirror is adjusted to compensate for the distortion, using feedback from the scattered light.

The process is repeated continuously, with the deformable mirror adjusting in real-time to correct for any changes in the turbulence.

This process can be used to correct for turbulence-induced wavefront distortion in a variety of applications, including astronomy and free-space optical communication. By using feedback from scattered light to correct for the distortion, the quality of the image or signal can be greatly improved, resulting in clearer and more accurate data.

Figure 6:
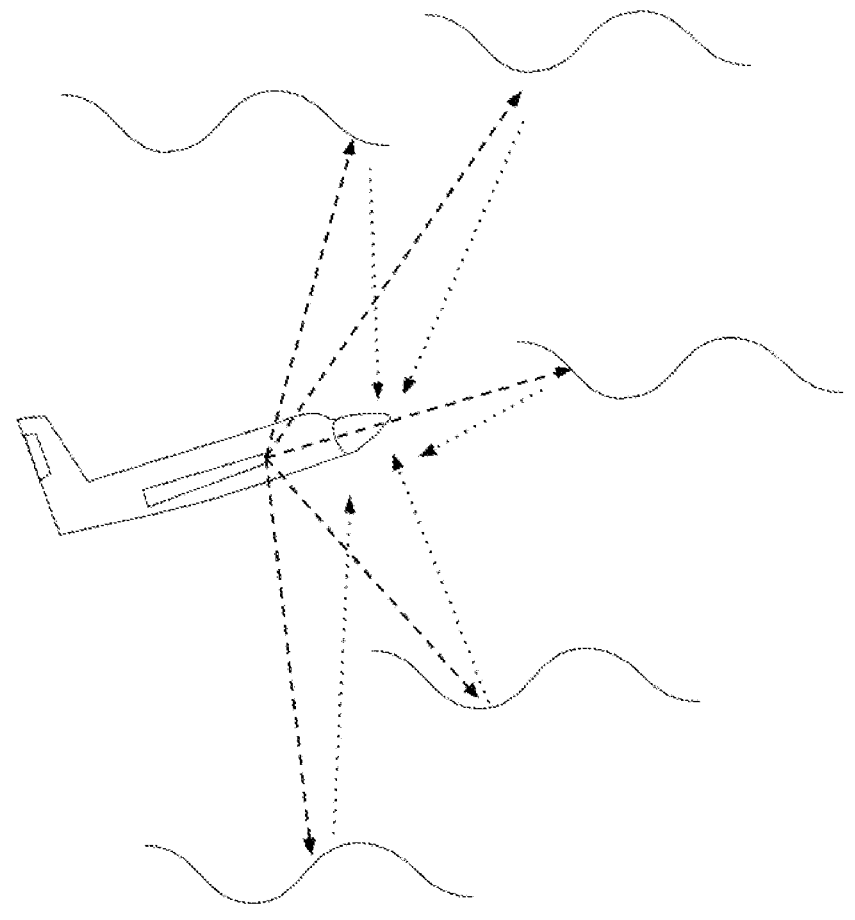
FIG. 6 illustrates a demonstration of a plane in flight using a three-dimensional LIDAR laser system according to an example of the present invention.

FIG. 6 illustrates a demonstration of a plane in flight using a three-dimensional LiDAR laser system according to an example of the present invention. As shown, the plane uses a LiDAR laser system for detecting and correcting for air turbulence, as shown. In an example, the demonstration is showcasing the scattering and detection clear air turbulence (CAT) in a cone shaped radius projecting forwards around the airplane. With the laser LiDAR system mounted on various points of the plane measuring several different angles and ranges reflected back towards the plane upon encountering clear air turbulence.

In an example, the present system is mounted on an aircraft capable of flight. The AlGaN containing laser device is coupled to a front region of a fuselage or wing region and the sensing device being coupled to a wing region of the aircraft. Other suitable regions of the aircraft can also be used.

In an example, the present techniques use an artificial intelligence (AI) inference engine for receiving sensor information of air turbulence for an aircraft and outputting a signal to correct a flight path of the aircraft from the turbulence can be designed using machine learning algorithms and techniques.

In an example, the system includes sensors, preprocessing, machine learning, inference engine, and a feedback loop. In an example, sensors installed on the aircraft are responsible for detecting the air turbulence and providing information about its magnitude and location. The data collected by these sensors is sent to the AI inference engine for processing.

In an example, data collected by the sensors are preprocessed to remove noise and other unwanted signals. The preprocessed data is then converted into a format that can be used by the AI inference engine for training and testing. In an example, the AI inference engine is trained using machine learning models, such as decision trees, neural networks, or support vector machines, to learn patterns and relationships between the sensor data and the aircraft's flight path. These models can also be used to predict future turbulence events. In an example, the engine has a plurality of nodes, including 1,000 nodes and greater, 10,000 nodes and greater, a million nodes and greater, a billion nodes and greater, or a billion nodes and greater. In an example, the AI inference engine can be configured using a semiconductor chip, such as a processor, graphic processing unit, in memory processor, among others, for fast and compact usage.

In an example, once the machine learning models are trained, the leaning models are deployed in the inference engine. The inference engine receives real-time data from the sensors and uses the trained models to generate a signal to correct the flight path of the aircraft. The signal can be sent to the autopilot system or to the flight crew to make the necessary adjustments. In an example, the system also includes a feedback loop to continuously improve the performance of the AI inference engine. The feedback loop involves collecting data about the aircraft's flight path and the effectiveness of the signal generated by the inference engine. This data is then used to retrain the machine learning models to improve their accuracy and reliability.

In an example, the present AI inference engine for receiving sensor information of air turbulence for an aircraft and outputting a signal to correct a flight path of the aircraft from the turbulence can help improve the safety and efficiency of air travel by providing real-time guidance to pilots and autopilot systems to avoid or mitigate turbulence. In an example, the LiDAR can be configured as a Rayleigh LiDAR technique, including system and method.

As used herein, the terms "Group-III nitrides" or "III-nitrides" or "nitrides" as used herein refer to any alloy composition of the (Ga, Al, In, B) N semiconductors having the formula $Ga_nAl_xIn_yB_zN$ where $0 \leq n \leq 1$, $0 \leq x \leq 1$, $0 \leq y \leq 1$, $0 \leq z \leq 1$, and $n+x+y+z=1$. These terms as used herein are intended to be broadly construed to include respective nitrides of the single species, Ga, Al, In and B, as well as binary, ternary and quaternary compositions of such Group III metal species. Accordingly, these terms include, but are not limited to, the compounds of AlN, GaN, InN, AlGaN, AlInN, InGaN, and AlGaInN. When two or more of the (Ga, Al, In, B) N component species are present, all possible compositions, including stoichiometric proportions as well as off-stoichiometric proportions (with respect to the relative mole fractions present of each of the (Ga, Al, In, B) N component species that are present in the composition), can be employed within the broad scope of this invention. Further, compositions and materials within the scope of the invention may further include quantities of dopants and/or other impurity materials and/or other inclusional materials.

In an example, the aforementioned invention provides a novel distributed feedback (DFB) laser, which is a type of semiconductor laser that utilizes a periodic grating structure to create optical feedback and maintain laser oscillation. In an example, the AlGaN DFB laser with an ITO grating region or regions uses aluminum gallium nitride (AlGaN) as the semiconductor material and indium tin oxide (ITO) as the material for the grating region or regions, among other elements. In an example, the ITO grating structure is configured on top of the AlGaN active region and is designed to have a specific period and depth to create feedback for laser oscillation. In an example, the use of AlGaN as the semiconductor material allows for the emission of light in the ultraviolet (UV) wavelength range, which is useful for applications such as communications, e.g., LiDAR, for air turbulence detection, water purification, sterilization, and detection of biological and chemical agents or materials. Another advantage is that the use of ITO as the material for the grating region or regions allows for a high degree of control over the grating structure, which can lead to improved laser performance and efficiency.

REFERENCES

The following publications are incorporated by reference herein:

[1] P. Vrancken et al., "Airborne forward pointing UV Rayleigh LiDAR for remote clear air turbulence detection: system design and performance" Applied Optics, 55, No. 32, (2016).

[2] Zhang, Haojun, Daniel A. Cohen, Philip Chan, Matthew S. Wong, Shlomo Mehari, Daniel L. Becerra, Shuji Nakamura, and Steven P. DenBaars. "Continuous-wave operation of a semipolar InGaN distributed-feedback blue laser diode with a first-order indium tin oxide surface grating." *Optics Letters* 44, no. 12 (2019): 3106-3109.

While the above is a full description of the specific examples, various modifications, alternative constructions, and equivalents may be used. As an example, the packaged device can include any combination of elements described above, as well as outside of the present specification. Therefore, the above description and illustrations should not be taken as limiting the scope of the present invention which is defined by the appended claims.

What is claimed is:

1. A light detection and ranging system comprising:
an aluminum gallium nitride (AlGaN) containing laser diode device configured to emit electromagnetic radiation having a wavelength ranging from 280 nm to 470 nm, and comprising:
a gallium and nitride containing substate member;
an n-type gallium nitride containing cladding material overlying the substrate member;
a first n-type gallium nitride containing waveguide material overlying the n-type gallium nitride containing cladding material;
a first barrier material overlying the first n-type gallium nitride material, the first barrier material comprising an aluminum, gallium, and nitrogen containing material;

a plurality of quantum well regions overlying the first barrier material, the plurality of quantum well regions comprising at least a first quantum well region and a second quantum well region, each of the quantum well regions ranging in thickness from 2 nanometers to 5 nanometers, each quantum well region comprising an aluminum, gallium, and nitrogen containing material;
a second barrier material comprising aluminum, gallium, and nitrogen containing material configured between the first quantum well region and the second quantum well region;
a confinement factor characterizing each of the quantum well regions is greater than one percent per quantum well region;
an electron blocking material overlying the quantum well regions;
a p-type gallium nitride containing waveguide material overlying the electron blocking material;
a p-type gallium and nitride containing cladding material overlying the p-type gallium nitride containing waveguide material;
a contact region comprising an indium tin oxide material overlying the p-type gallium and nitrogen cladding material;
a front facet coupled to a front side of the n-type gallium nitride containing waveguide material and a front side of the p-type gallium nitride containing waveguide material, the front facet comprising an antireflective coating;
a back facet coupled to a back side of the n-type gallium nitride containing waveguide and a back side the p-type gallium nitride containing waveguide, the back facet comprising an optical coating;
an optical cavity configured between the front facet and the back facet including the plurality of quantum well regions defined between the front facet and the back facet;
a monolithically integrated diffraction grating configured within or overlying the contact region and configured to reflect electromatic radiation emitted from one or more of the plurality of quantum well regions and cause the electromagnetic radiation to amplify the electromagnetic radiation using stimulated emission in the optical cavity thereby outputting a laser light beam from the front facet;
a characteristic dimension of m(λ/2n) characterizing a pitch of two or more lines configured in the monolithically integrated diffraction grating, where m is an order of a grating and n is a refractive index of a semiconductor material for the optical cavity;
a sensing device operably coupled to the AlGaN containing laser diode device and configured to receive a signal scattered from an interaction of an air turbulence and an emission 47 of the electromagnetic radiation from the AlGaN containing laser diode and detect the air turbulence from the scattered signal; and
a controller operably coupled to the sensing device and the AlGaN containing laser diode device, the controller being adapted to process a signal generated from the sensing device.

2. The system of claim 1 wherein the monolithically integrated diffraction grating comprises a single grating region or a plurality of grating regions; wherein the p-type gallium nitride containing waveguide material comprising aluminum; and wherein the n type gallium nitride containing waveguide material comprises aluminum.

3. The system of claim 1 wherein the back facet comprises an antireflective coating or a reflective coating for the optical coating.

4. The system of claim 3 where in the antireflective coating on the front facet and the back facet characterizes a phase shifted distributed feedback laser device.

5. The system of claim 3 wherein the antireflective coating on the back facet and the reflective coating on the front facet characterize a non-phase shifted distributed feedback laser device.

6. The system of claim 1 wherein the system is mounted on an aircraft capable of flight, the AlGaN containing lase device being coupled to a front region of a fuselage or wing region and the sensing device being coupled to a wing region of the aircraft.

7. The system of claim 1 wherein the AlGaN containing laser device is monolithically integrated to form a compact structure.

8. The system of claim 1 wherein the AlGaN containing laser device is a distributed feedback laser device or a tunable laser diode device configured for emitting a blue color light.

9. The system of claim 1 further comprising an input handler configured to the sensing device, the input handler being coupled to process the signal in an inference engine comprising a plurality of nodes, the number of nodes ranging from 10,000 to over 1 million to output a signal detecting clear air turbulence or another anomaly.

10. The system of claim 1 wherein the electromagnetic radiation has a wavelength range selected from 450-470 nm, 400-460 nm, 320-400 nm, or 250-320 nm.

11. The system in claim 1 wherein the AlGaN containing laser diode device is pulsed by direct current configured to a modulation.

12. The system in claim 1 wherein the AlGaN containing laser diode device is modulated by an integrated modulator.

13. The system in claim 1 wherein the AlGaN containing laser diode device is steered and reflected into the sensor device using a free space optical system, shaped lens, a MEMS system, or steerable mirror.

14. The system of claim 1 further comprising a driver device coupled to the AlGaN containing laser diode device.

15. The system of claim 1 wherein the AlGaN containing laser diode device further comprises a power of one milliwatt and greater characterizing the AlGaN containing laser diode device.

16. A light detection and ranging system comprising:

an AlGaN containing laser diode device configured to emit electromagnetic radiation having a wavelength ranging from 280 nm to 470 nm, and comprising:

a gallium and nitride containing substate member;

an n-type gallium nitride containing cladding material overlying the gallium and nitride containing substrate member;

an n-type aluminum gallium nitride containing waveguide material overlying the n-type gallium nitride containing cladding material;

a first barrier material overlying the n-type aluminum gallium nitride 9 waveguide material, the first barrier material comprising an aluminum, gallium, and nitrogen containing material;

a plurality of quantum well regions overlying the first barrier material, the plurality of quantum well regions comprising at least a first quantum well region and a second quantum well region, each of the quantum well regions ranging in thickness from 2 nanometers to 5 nanometers, each of the quantum well regions comprising an aluminum, gallium, and nitrogen containing material;

a second barrier material comprising aluminum, gallium, scandium, and nitrogen containing material configured between the first quantum well region and the second quantum well region;

a confinement factor characterizing each of the plurality of quantum well regions is greater than one percent per quantum well region;

an electron blocking material overlying the plurality of quantum well regions;

a p-type aluminum gallium nitride containing waveguide material overlying the electron blocking material;

a p-type gallium nitride containing cladding material overlying the p-type aluminum gallium nitride containing waveguide material;

a contact region comprising an indium tin oxide material overlying the p-type gallium nitride cladding material;

a front facet coupled to the n-type aluminum gallium nitride containing waveguide material and the p-type aluminum gallium nitride containing waveguide material, the front facet comprising an antireflective coating;

a back facet coupled to the n-type aluminum gallium nitride containing waveguide material and the p-type aluminum gallium nitride containing waveguide material, the back facet comprising an optical coating;

an optical cavity configured between the front facet and the back facet and comprising the plurality of quantum well regions defined between the front facet and the back facet such that the front facet is opposite of the back facet;

a monolithically integrated diffraction grating configured within or overlying the contact region and configured to reflect electromatic radiation emitted from one or more of the plurality of quantum well regions and cause the electromagnetic radiation to amplify the 40 electromagnetic radiation using stimulated emission thereby outputting a laser light beam from the front facet;

a characteristic dimension of $m(\lambda/2n)$ characterizing a pitch between at least a pair of lines of the monolithically integrated diffraction grating, where m is the order of a grating; and n is a refractive index of a semiconductor material for the optical cavity;

a sensing device operably coupled to the AlGaN containing laser diode device and configured to receive a signal scattered from an interaction of an air turbulence and an emission of the electromagnetic radiation and detect the air turbulence from the scattered signal; and a controller operably coupled to the sensing device and the AlGaN containing laser diode device, the controller being adapted to process a signal generated from the sensing device.

17. The system of claim 16 wherein the monolithically integrated diffraction grating comprises a single grating region or a plurality of grating regions.

18. The system of claim 16 wherein the front facet comprises an antireflective coating or a reflective coating for the optical coating; wherein the antireflective coating on the front facet and the back facet characterizes a phase shifted distributed feedback laser device; or wherein the antireflective coating on the back facet and the reflective coating on the front facet characterizes a non-phase shifted distributed feedback laser device.

19. The system of claim 16 wherein the system is mounted on an aircraft, the AlGaN containing lase device being coupled to a front region of a fuselage and the sensing device being coupled to a wing region of the aircraft.

20. The system of claim 16 wherein the AlGaN containing laser device is monolithically integrated; wherein the AlGaN containing laser device is a distributed feedback laser device or a tunable laser diode device configured for emitting a blue color light.

21. The system of claim 16 further comprising a input handler configured to the sensing device, the input handler being coupled to process the signal in an inference engine comprising a plurality of nodes, the number of nodes ranging from 10,000 to over 1 million to output a signal detecting clear air turbulence or another anomaly.

22. The system of claim 16 wherein the electromagnetic radiation has a wavelength range selected from 450-470 nm, 400-460 nm, 320-400 nm, or 250-320 nm.

23. The system in claim 16 wherein the AlGaN containing laser diode device is pulsed by direct current modulation or wherein the AlGaN containing laser diode device is modulated by an integrated modulator.

24. The system in claim 16 wherein the laser diode device is steered and reflected into the sensor device using a free space optical system, shaped lens, a MEMS system, or steerable mirror.

25. The system of claim 16 further comprising a driver device coupled to the AlGaN containing laser diode device.

26. The system of claim 16 wherein the AlGaN containing laser diode device further comprising a power of one milliwatt and greater characterizing the AlGaN containing laser diode device.

\* \* \* \* \*